(12) United States Patent
Dewey et al.

(10) Patent No.: US 11,380,684 B2
(45) Date of Patent: Jul. 5, 2022

(54) STACKED TRANSISTOR ARCHITECTURE INCLUDING NANOWIRE OR NANORIBBON THIN FILM TRANSISTORS

(71) Applicant: INTEL CORPORATION, Santa Clara, CA (US)

(72) Inventors: Gilbert Dewey, Beaverton, OR (US); Aaron Lilak, Beaverton, OR (US); Cheng-Ying Huang, Hillsboro, OR (US); Jack Kavalieros, Portland, OR (US); Willy Rachmady, Beaverton, OR (US); Anh Phan, Beaverton, OR (US); Ehren Mannebach, Beaverton, OR (US); Abhishek Sharma, Hillsboro, OR (US); Patrick Morrow, Portland, OR (US); Hui Jae Yoo, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 769 days.

(21) Appl. No.: 16/145,817

(22) Filed: Sep. 28, 2018

(65) Prior Publication Data
US 2020/0105751 A1    Apr. 2, 2020

(51) Int. Cl.
| | | |
|---|---|---|
| *H01L 27/092* | (2006.01) | |
| *H01L 29/06* | (2006.01) | |
| *H01L 29/786* | (2006.01) | |
| *H01L 29/423* | (2006.01) | |
| *H01L 29/08* | (2006.01) | |
| *H01L 29/10* | (2006.01) | |

(52) U.S. Cl.
CPC ...... *H01L 27/0922* (2013.01); *H01L 29/0673* (2013.01); *H01L 29/0847* (2013.01); *H01L 29/1033* (2013.01); *H01L 29/42392* (2013.01); *H01L 29/7869* (2013.01); *H01L 29/78618* (2013.01); *H01L 29/78696* (2013.01)

(58) Field of Classification Search
CPC ............ H01L 27/0922; H01L 27/0688; H01L 29/0673; H01L 29/0847; H01L 29/42392; H01L 2029/7858
See application file for complete search history.

(56) References Cited

U.S. PATENT DOCUMENTS

| | | | |
|---|---|---|---|
| 9,837,414 B1 * | 12/2017 | Balakrishnan | ............................. H01L 21/823871 |
| 2011/0012085 A1 * | 1/2011 | Deligianni | .......... H01L 29/0676 257/9 |
| 2017/0117367 A1 * | 4/2017 | Engel | ................ H01L 29/41725 |
| 2019/0026519 A1 * | 1/2019 | Park | ........................ G01L 1/146 |

* cited by examiner

*Primary Examiner* — Changhyun Yi
(74) *Attorney, Agent, or Firm* — Schwabe, Williamson & Wyatt P.C.

(57) ABSTRACT

Stacked transistor structures including one or more thin film transistor (TFT) material nanowire or nanoribbon channel regions and methods of forming same are disclosed. In an embodiment, a second transistor structure has a TFT material nanowire or nanoribbon stacked on a first transistor structure which also includes nanowires or nanoribbons comprising TFT material or group IV semiconductor. The top and bottom channel regions may be configured the same or differently, with respect to shape and/or semiconductor materials. Top and bottom transistor structures (e.g., NMOS/PMOS) may be formed using the top and bottom channel region structures. An insulator region may be interposed between the upper and lower channel regions.

24 Claims, 6 Drawing Sheets

US 11,380,684 B2

STACKED TRANSISTOR ARCHITECTURE INCLUDING NANOWIRE OR NANORIBBON THIN FILM TRANSISTORS

BACKGROUND

Integrated circuitry continues to scale to smaller feature dimensions and higher transistor densities. A more recent development with respect to increasing transistor density is generally referred to as three-dimensional (3D) integration, which expands transistor density by exploiting the Z-dimension (build upwards in addition to laterally outwards in the X and Y dimensions). Some such 3D integrated circuits are monolithic in nature, in that they are formed utilizing a technique known as layer transfer. Such layer transfer may include, for instance, bond and hydrogen-based or hydrogen/helium based cleave techniques. Another means of performing layer transfer is to bond (such as with an oxide) two distinct wafers (sometimes referred to as host and donor wafers or substrates) and then perform a chemical-mechanical polish (CMP) operation to remove bulk of the bonded wafer leaving only a relatively thin region on the host wafer. This bond and polish operation may also utilize an etchstop embedded within the donor wafer. In any such cases, such 3D integration schemes give rise to a number of non-trivial issues which can cause degraded device performance and reliability.

Figure 1:
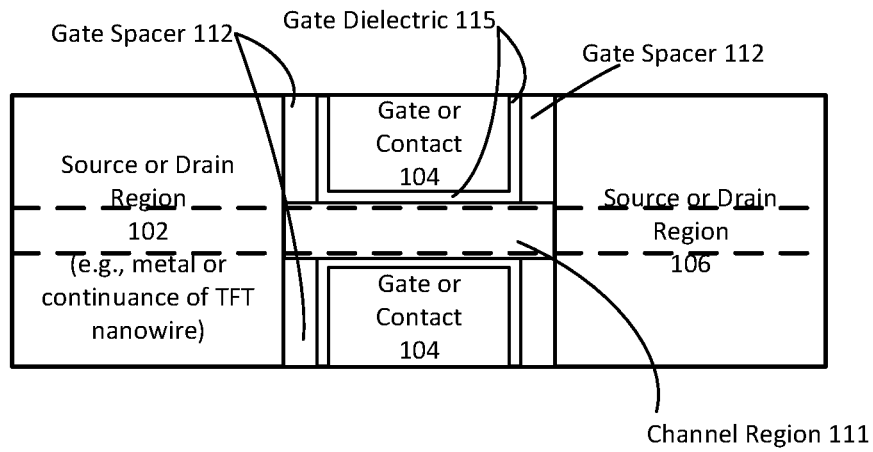
FIG. 1 illustrates a top-down cross-section view of an integrated circuit structure including a source and drain region connected by a gate defining a channel region passing therethrough, in accordance with an embodiment of the present disclosure. The cross-section is taken parallel to and through the channel region so as so show the nanowire or nanoribbon and the gate structure wrapped therearound.

As will be appreciated, the figures are not necessarily drawn to scale or intended to limit the present disclosure to the specific configurations shown. For instance, while some figures generally indicate perfectly straight lines, right angles, and smooth surfaces, an actual implementation of an integrated circuit structure may have less than perfect straight lines, right angles, and some features may have surface topology or otherwise be non-smooth, given real world limitations of the processing equipment and techniques used.

DETAILED DESCRIPTION

Stacked non-planar transistor structures and methods of forming same are disclosed. A stacked transistor architecture is disclosed that employs a common fin-like structure that includes lower transistor and upper transistor portions. The fin-like structure includes multilayer stacks suitable for forming nanowire or nanoribbon transistors. In some cases, the upper and lower transistor portions are separated by an insulative isolation region built into the fin structure. The lower transistor and upper transistor portions include nanowire-based or nanoribbon-based channel regions which are released (by selectively etching away a sacrificial material included in the multilayer stacks) during gate processing. In an embodiment, a stacked transistor structure has thin film material (TFT) N-type Metal Oxide Semiconductor (NMOS) nanowire or nanoribbon transistor devices stacked on P-type Metal Oxide Semiconductor (PMOS) nanowire or nanoribbon transistor devices. In other embodiments, the stacked transistor structure includes TFT NMOS nanowire (or nanoribbon) transistor devices stacked on TFT PMOS nanowire (or nanoribbon) transistor devices. In a more general sense, any number of stacked nanowire or nanoribbon transistor architectures will be apparent, where at least one of the upper or lower transistors include a TFT nanowire or TFT nanoribbon configuration (p-type or n-type). In any such cases, upper and lower gate structures wrap-around the respective nanowires (or nanoribbons). The gate structures include a gate dielectric and a gate electrode. In addition, the gate structures may be tailored to p-type or n-type, by using appropriate work function metal in the gate electrode structure. The top and bottom channel regions may be configured the same or differently with respect to geometry (e.g., upper channel nanowires can be thinner than the lower channel nanowires), as will be appreciated in light of this disclosure. Numerous configurations will be apparent. The top and bottom transistor structures can be fabricated using, for instance, gate-first or gate-last processing, as well as etch-and-replace epitaxial source and drain region processing or other such processing (as described below).

General Overview

As previously explained, 3D integration schemes give rise to a number of non-trivial issues which can cause degraded device performance and reliability. For instance, existing solutions tend to improve density, but without significant performance gains. Moreover, existing solutions tend to rely on use of silicon rather than use of higher performance materials, and further inhibit omission of the native substrate.

Thus, stacked transistor structures and methods of forming same are disclosed herein. In an embodiment, a stacked transistor structure has at least one channel region employing TFT nanowires or nanoribbons above (or below) another nanowire or nanoribbon transistor channel region. The top and bottom channel regions may be configured the same or differently, with respect to shape and/or semiconductor materials. For instance, in one example embodiment, the top channel region is configured with one or more TFT material nanowires or nanoribbons, and the bottom channel region is configured with one or more nanoribbons or nanowires that are compositionally different from the TFT material nanowires or nanoribbons. In some such example cases, for instance, the TFT material nanowires or nanoribbons comprise indium-gallium-zinc oxide (InGaZnO or IGZO), gallium oxide (GaO), zinc oxide (ZnO), indium oxide (InO), antimony oxide (SbO), copper oxide (CuO), indium antimony oxide (InSbO), aluminum zinc oxide (AlZnO), molybdenum disulfide ($MoS_2$), cadmium oxide (CdO), indium(III) oxide ($In_2O_3$), gallium(III) oxide ($Ga_2O_3$), tin(IV) oxide ($SnO_2$), indium zinc oxide (IZO), indium tin oxide (ITO), gallium zinc oxide (GZO), titanium dioxide ($TiO_2$), tin(II) oxide (SnO), cuprous oxide ($Cu_2O$), copper(II) oxide (CuO), vanadium(IV) oxide ($VO_2$), nickel/nickel(II) oxide (NiO), zinc rhodium oxide ($ZnRh_2O_4$), aluminum copper dioxide ($AlCuO_2$), strontium cuprate (SCO) ($SrCu_2O_2$), lanthanum selenium dioxide ($La_2SeO_2$), or other materials suitable for NMOS devices. And, in some such example cases, the other channel nanowires or nanoribbons comprise, for instance, PMOS TFT materials, or PMOS crystalline materials such as silicon (Si), silicon germanium (SiGe), germanium (Ge), or other crystalline materials suitable for PMOS devices. In still other embodiments, the top and bottom may be reversed with e.g., a TFT PMOS stacked on a crystalline NMOS or TFT NMOS device. Numerous configurations and permutations will be apparent in light of this disclosure.

In one specific example embodiment, the top channel region is configured with one or more semiconductor nanoribbons comprising a TFT NMOS material (e.g., IGZO) coated with a high-k gate dielectric material surrounded by an n-type work function gate metal electrode. The bottom channel region is configured with one or more semiconductor nanoribbons comprising a crystalline PMOS material (e.g., Si or SiGe or Ge) that is compositionally different from the TFT material, coated with a suitable gate dielectric and surrounded in a p-type work function gate metal electrode. In some such cases, the number of nanoribbons making up the top channel region is different from the number of nanoribbons making up the bottom channel region. In other such embodiments, the number of nanowires or nanoribbons on the top is the same as the number of nanowires or nanoribbons on the bottom, but the nanowires or nanoribbons on the bottom may be wider than the nanowires or nanoribbons on the top, or vice-versa. Again, numerous variations and permutations will be apparent in light of the present disclosure. For example, a PMOS TFT nanowire or nanoribbon channel region may be stacked on an NMOS TFT nanowire or nanoribbon channel region.

As will be further appreciated, the difference between a nanowire and a nanoribbon is with respect to aspect ratio, to some extent. In particular, a nanoribbon is typically wider than it is tall, like a pancake for instance. In any such embodiments, an insulator region, such as a thin insulator including, e.g., an oxide or oxynitride, may be used to isolate the upper transistor device from the lower transistor device. The oxide or oxynitride of the insulator region may be the same as the gate dielectric oxide formed on the nanowires or nanoribbons or may be compositionally different.

In any such cases, the resulting structure having top and bottom non-planar channel regions can be processed to form top and bottom gate-all-around transistor devices. In complementary metal oxide semiconductor (CMOS) configurations, one of the top or bottom can be PMOS and the other of the top or bottom can be NMOS. In other embodiments, the top and bottom transistors may be the same type (both PMOS or NMOS), depending on the integrated circuit being fabricated.

Gate-first and gate-last processes, as well as TFT source/drain processes and etch-and-replace epitaxial source/drain processes, may be used, as will be appreciated. The top and bottom gate structures may be the same in some embodiments, and different in other embodiments such as in cases that utilize a CMOS configuration where, for example, the top gate structure has an n-type work function metal and the bottom gate structure has a p-type work function metal. In some example embodiments, for instance, the gate forming process includes a gate-last process wherein after the dummy gate materials are removed to expose the top and bottom channel regions of the stacked transistor structure, and then a first type of final gate structure is deposited over both the exposed top and bottom channel regions. The gate structure over the top channel region is then recessed down to the gate structure of the bottom channel region, thereby removing that gate structure from the top channel region. An insulator deposition and recess process can then be carried out to provide isolation between the top and bottom device layers. The top final gate structure may then be applied. In some cases, the nanowires or nanoribbons making up a given channel region are released prior to deposition of the dummy gate materials, while in other embodiments the nanowires or nanoribbons making up the channel region are released after removal of the dummy gate materials. In either case, an etch selective to the channel material can be used to remove the alternate or so-called sacrificial material from the multilayer stack in the exposed channel region. Gate spacers may be formed on opposing lateral sides of the gate structure to ensure isolation of the gate electrode from the source and drain structures. Once the channel nanowires or nanoribbons are released, the final gate materials, including a gate dielectric structure and a gate electrode structure, are provided in a wrap-around configuration.

Source and drain processing may be carried out prior to final gate structure formation, but not necessarily in all cases (such as in gate-first processes). In any such cases, and according to some embodiments, the source and drain regions associated with the top channel region may be processed first using an etch and replace process to provide the desired source and drain regions, followed by contact formation. The structure can then be rotated and the source and drain regions of the bottom device layer can be processed. For instance, in some embodiments, source and drain regions for non-TFT transistors can be formed with an etch and replace process, where epitaxial source/drain regions are provided. In some such embodiments, source and drain regions for the TFT transistors are formed by removing TFT and sacrificial materials in the source and drain regions and depositing a metal in their place. In other embodiments, a selective etch is employed in the source/drain regions of the TFT transistors to remove only the sacrificial material, and a metal is deposited in its place to provide a wrap-around contact structure. In any such cases, the source and drain materials can be doped to provide the desired polarity. Once the source and drain regions and respective contact structures associated with the top channel region are completed, a protective layer (e.g., oxide or nitride) may be provided thereon so that the structure may be flipped so that the source and drain regions associated with the bottom channel region may be processed. Similar processing used on the top source and drain regions may be used to provide the desired source and drain regions associated with the bottom, as well as the contact structures thereon. The top and bottom source and drain regions may be the same or different, with respect to, for example, dopant type, dopant concentration, and/or source and drain materials. Note, that in any such cases, gate spacers may be formed, for example, after removal of sacrificial and/or channel material by way of trenches in the source and drain regions (during source/drain processing) or by way of trenches in the channel regions (during gate processing), as will be appreciated.

Various advantages of the techniques provided herein will be appreciated, particularly with respect to improved logic transistor density and performance, amongst other features, according to some embodiments. As will be further appreciated, a stacked transistor structure configured in accordance with some embodiments also eases the integration of nanowire or nanoribbon structures for one device layer (e.g., bottom transistor) with TFT nanowire or nanoribbon structures for the other device layer (e.g., top transistor) without requiring a native substrate. This may allow for use of material systems with higher performance and better gate control, e.g., suffering less short-channel effects, than strictly silicon-based transistors. Moreover, note that having TFT materials in a stacked CMOS structure reduces concerns with respect to thermal budget.

In more detail, typical thin film semiconducting oxide deposition and processing temperatures to fabricate transistors is less than 500 C. This low temperature of deposition and fabrication allows a layer of TFT transistors to be deposited and fabricated on top of a bottom or otherwise previously formed layer of transistors without any temperature steps that would degrade the gate or contacts of the previously formed transistors. This is one of the challenges for doing stacked crystalline semiconductors. To this end, TFTs effectively allow for a lower temperature processing advantage in a CMOS stack. For example, if crystalline silicon were used in a top layer of devices, the silicon could be layer transferred, but in order to get good contact, the source and drain regions would need to be grown with doping in them (in situ), or implanted and annealed. Such a process can be higher than 750 C. The previously formed transistors that already have gate, source, and drain regions formed will degrade in that kind of temperature. That is one reason why in modern processing of planar transistors, the source, drain, and gate contacts are done last. In contrast, the lower processing temperatures associated with TFTs would be relatively benign to a bottom or otherwise previously formed layer of crystalline material transistors in the stack. To this end, the relatively low temperature TFT processing allows for a stacked CMOS configuration that includes crystalline materials in addition to TFT materials, according to some embodiments.

Further note that the TFT layers need not be epitaxially grown but instead may be deposited on any suitable planarized substrate such as an oxide, e.g., carbide, oxynitride, nitride, or any suitable material that provides etch selectivity for the sacrificial layers during fabrication with respect to the TFT layers. Thereby, in some embodiments, stacked and self-aligned transistors provide for improved density, with high mobility TFT nanowire or TFT nanoribbon structures providing improved performance such as electrostatic gate control and improved immunity to short channel effects. Numerous configurations and permutations will be apparent in light of this disclosure.

Materials that are "compositionally different" or "compositionally distinct" as used herein refers to two materials that have different chemical compositions. This compositional difference may be, for instance, by virtue of an element that is in one material but not the other (e.g., SiGe is compositionally different than silicon), or by way of one material having all the same elements as a second material but at least one of those elements is intentionally provided at a different concentration in one material relative to the other material (e.g., SiGe having 70 atomic percent germanium is compositionally different than from SiGe having 25 atomic percent germanium). In addition to such chemical composition diversity, the materials may also have distinct dopants (e.g., gallium and magnesium) or the same dopants but at differing concentrations. In still other embodiments, compositionally distinct materials may further refer to two materials that have different crystallographic orientations. For instance, (110) silicon is compositionally distinct or different from (100) silicon. Creating a stack of different orientations could be accomplished, for instance, with blanket wafer layer transfer.

Note that the use of "source/drain" herein is simply intended to refer to a source region or a drain region or both a source region and a drain region. To this end, the forward slash ("/") as used herein means "and/or" unless otherwise specified, and is not intended to implicate any particular structural limitation or arrangement with respect to source and drain regions, or any other materials or features that are listed herein in conjunction with a forward slash.

Architecture

FIG. 1 illustrates a top-down cross-section view of an integrated circuit including a stacked transistor structure having an, e.g., NMOS TFT stacked on a, e.g., group IV semiconductor PMOS transistor, in accordance with an embodiment of the present disclosure. The cross-section is taken parallel to and through the TFT channel region so as so show the TFT nanowire or nanoribbon and the gate structure wrapped therearound. The bottom transistor is not visible in this particular view. As can be seen, the NMOS TFT includes a source/drain region 102, a source/drain region 106, and a gate or contact 104 therebetween defining the channel region 111. The channel region 111 includes one or more nanowires or nanoribbons extending between source/drain region 102 and source/drain region 106. As can be further seen, the gate structure 104 surrounds the nanowire(s) or nanoribbon(s) in a gate-all-around arrangement, with a gate dielectric 115 wrapped around the nanowires or nanoribbons, and a gate electrode or contact 104 wrapped around the gate dielectric 115. Insulative gate spacers 112 are interposed between source or drain region 102 and the gate or contact 104 and between the gate or contact 104 and source or drain region 106.

Figure 2A:
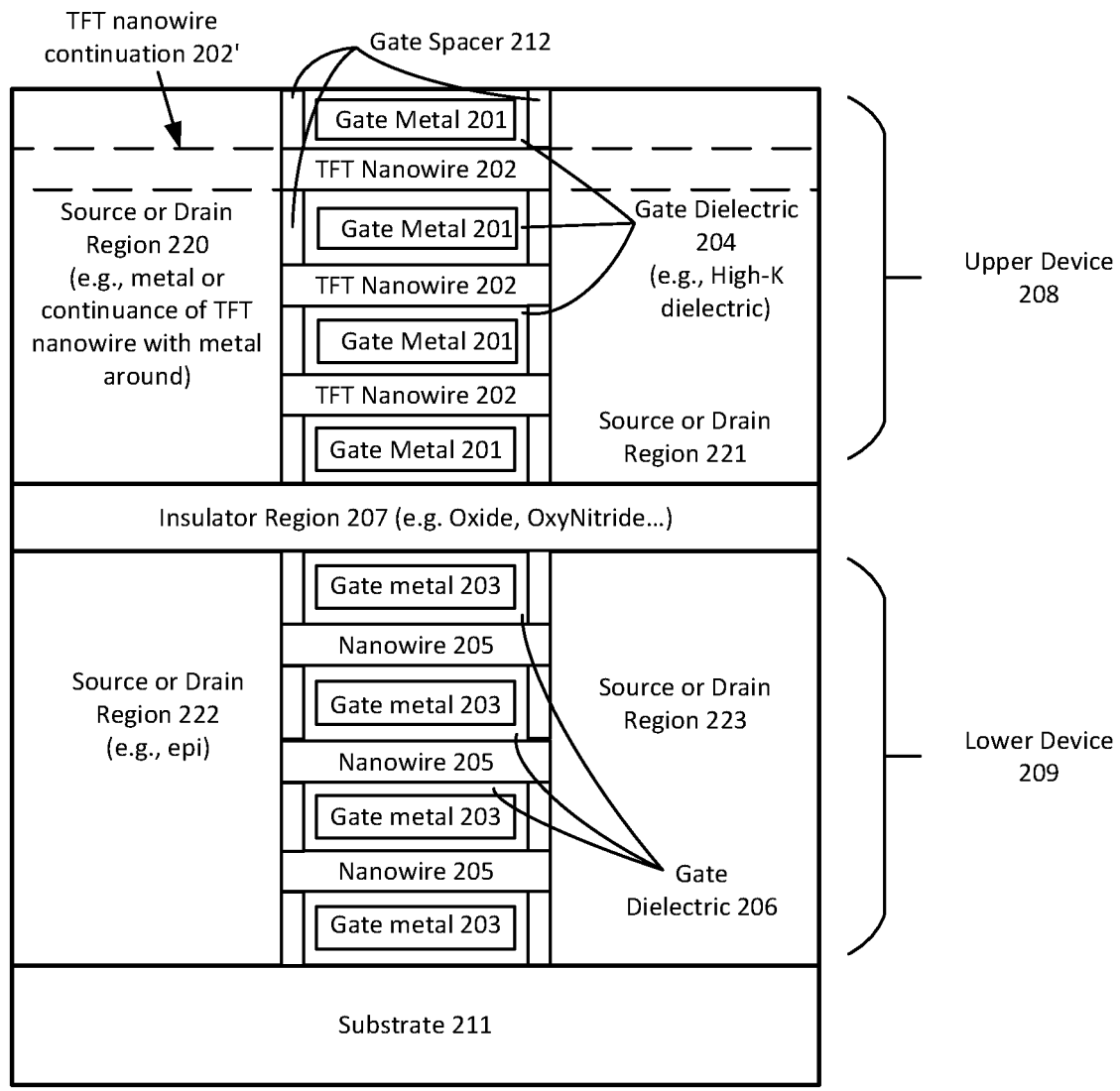
FIGS. 2a and 2b each illustrate a cross-section view of an integrated circuit, in accordance with an embodiment of the present disclosure. The cross-section is taken perpendicular to the gate (parallel to the channel region extending from source to drain) and centered through the channel region of the structure.

FIG. 2a illustrates a cross-sectional view taken perpendicular to the gate (parallel to and centered in the channel region of the structure). As can be seen, this example configuration includes three thin film transistor (TFT) material nanowires or nanoribbons 202 in the channel region of the upper device 208, and three nanowires or nanoribbons 205 in the channel region of the lower device 209. One or more of the TFT nanowires 202 may extend the length of the device, continuing throughout the source/drain and the gate region, as seen in TFT nanowire 202' (as depicted with dashed lines). In other embodiments, the nanowires or nanoribbons 202 may be limited to the gated region. Other embodiments may have fewer or more nanowires or nanoribbons. As can be further seen in this example case, the nanoribbons are wrapped with a gate dielectric 204 and 206, respectively. As can further be seen, gate electrodes 201 and 203 are wrapped about gate dielectrics 204 and 206, respectively, and may include NMOS and/or PMOS gate metal or other suitable material serving as a gate electrode. Insulator region 207 provides electrical isolation between the upper and lower devices. Insulative gate spacers 212 (in concert with gate dielectric 204, 206) provide electrical isolation between the source or drain regions 220, 221 and adjacent gate metal 201 and between source or drain regions 222, 223 and adjacent gate metal 203.

Figure 2B:
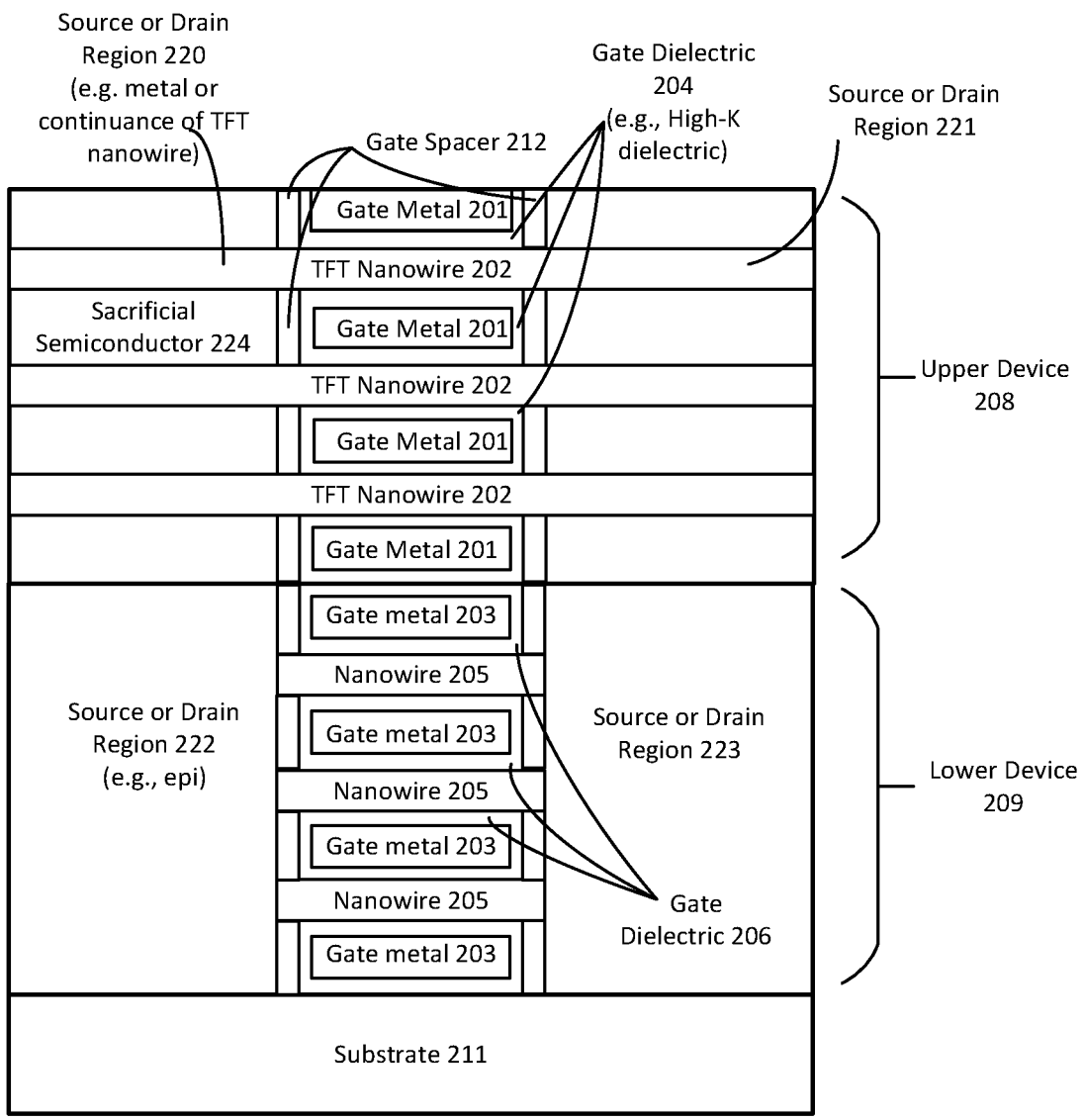

As can be further seen in FIG. 2a, insulator region 207 may be, for example, a layer of oxide or nitride or other suitable insulator (e.g., silicon oxide, silicon nitride, or oxynitride, to name a few examples). Note that insulator region 207 may be a bonding layer used to couple the upper device structure 208 to the lower device structure 209, according to some embodiments. Insulator region 207 is not necessary in all embodiments, and other embodiments may be configured differently. For example, insulator region 207 may be omitted altogether (as shown in FIG. 2b), or may be provided by way of doping or fixed charge isolation. In addition, if present, note that insulator region 207 may have vias or other interconnect features penetrating therethrough providing desired connectivity between corresponding stacked gates, sources, and/or drains. Numerous connectivity schemes and configurations may be used, as will be appreciated in light of this disclosure.

In an embodiment, thin film transistor or TFT nanoribbons 202 may comprise, for example, a first semiconductor material (e.g., indium-gallium-zinc oxide (InGaZnO or IGZO), gallium oxide (GaO), zinc oxide (ZnO), indium oxide (InO), antimony oxide (SbO), copper oxide (CuO), indium antimony oxide (InSbO), aluminum zinc oxide (AlZnO), molybdenum disulfide ($MoS_2$), cadmium oxide (CdO), indium(III) oxide ($In_2O_3$), gallium(III) oxide ($Ga_2O_3$), tin(IV) oxide ($SnO_2$), indium zinc oxide (IZO), indium tin oxide (ITO), gallium zinc oxide (GZO), titanium dioxide ($TiO_2$), tin(II) oxide (SnO), cuprous oxide ($Cu_2O$), copper(II) oxide (CuO), vanadium(IV) oxide ($VO_2$), nickel/nickel(II) oxide (NiO), zinc rhodium oxide ($ZnRh_2O_4$), aluminum copper dioxide ($AlCuO_2$), strontium cuprate (SCO) ($SrCu_2O_2$), lanthanum selenium dioxide ($La_2SeO_2$), or other materials suitable for NMOS) devices. In some such cases, nanowires or nanoribbons 205 and 202 may comprise the same materials, but in other embodiments may be compositionally different.

The upper and lower gate structures, may be implemented with any suitable processes and materials. Further note that, in addition to gate dielectrics 204 and 206, respectively, and gate electrodes 201 and 203, respectively, the gate structures may further include gate spacers 212. Any number of gate structure configurations may be used. If present, the gate spacers may generally include, e.g., an oxide material, a porous oxide material (which may have a lower k value), a silicon nitride, silicon dioxide, an oxynitride, a carbon-doped oxide or carbon-doped oxynitride, a multi-layer of materials with the inner material including a porous material while the outer layers provide etch-selectivity, an air-gap type spacer, or other suitable insulative gate spacer materials. The gate dielectrics 204 and 206, respectively, may be, for example, any suitable gate dielectric material(s) such as, e.g., silicon dioxide or high-k gate dielectric materials. Examples of high-k gate dielectric materials include, for instance, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric to improve its quality when a high-k material is used. Further, the gate electrodes 201 and 203, respectively may comprise a wide range of suitable metals or metal alloys, such as, e.g., aluminum, tungsten, titanium, tantalum, copper, titanium nitride, or tantalum nitride.

In some embodiments, the gate dielectrics 204 and 206 and/or gate electrodes 201 and 203 may include a multilayer structure of two or more material layers or components. For instance, in one such embodiment, the gate dielectric structures 204 and/or 206 is a bi-layer structure having a first dielectric material (e.g., silicon dioxide) in contact with the channel region and a second dielectric material (e.g., hafnium oxide) in contact with the first dielectric material, the first dielectric material having a dielectric constant that is lower than the dielectric constant of the second dielectric material. Likewise, the gate electrode structures 201 and 203 may include a central metal plug portion (e.g., tungsten) with one or more outer work function layers and/or barrier layers (e.g., tantalum, tantalum nitride, an aluminum-containing alloy), and/or a resistance reducing cap layer (e.g., copper, gold, platinum, cobalt, tungsten). In some embodiments, the gate dielectrics 204, 206 and/or gate electrodes 201, 203 may include grading (increasing or decreasing, as the case may be) of the concentration of one or more materials therein. Further note that the gate structure of the upper devices may be the same as the gate structure of the lower device, or different. In some example embodiments, for instance, the gate electrode 201 of the upper gate structure includes an n-type work function metal suitable for NMOS devices, while the gate electrode 203 of the lower gate structure includes a p-type work function metal suitable for PMOS devices. Numerous gate structure configurations may be used as will be appreciated in light of this disclosure, and the present disclosure is not intended to be limited to any particular such configurations.

Substrate 211 may be omitted or may remain incorporated. In some cases, substrate 211 has a bulk silicon (Si) or a silicon on insulator (SoI) configuration, although other materials and configurations can be used, as will be appreciated.

Source/drain regions 220, 221 may be metal in some embodiments, or continuations of one or more of the TFT nanowires 202 and possibly sacrificial materials 224 in combination with a contact metal. For instance, in some embodiments, both the TFT nanowires 202 and sacrificial material 224 are removed and replaced with a metal source/drain as is sometimes done with TFTs. In another embodiment, the TFT nanowires 202 extend and project from the channel or gate region throughout the source/drain regions, the sacrificial material 224 may be selectively etched to free the TFT nanowires in the source/drain regions 220, 221, and a metal may be inserted to replace the sacrificial material 224 in a wrap-around connection of the nanowires. In still other embodiments, the alternating stack may be doped or processed to provide the source/drain regions 220, 221. The source/drain metal, if present, can be any number of low resistivity metals such as, copper, ruthenium, tin, tungsten, aluminum, gold, silver, and platinum. In some cases where the TFT source/drain material is the same material as the TFT channel itself, the source/drain regions 220, 221 can be doped with techniques such as using an oxygen exchange layer which effectively is a metal that causes oxygen to leave the TFT material due to affinity for the metal and oxidize a portion of the metal. The oxygen vacancy can then be ionized to effectively introduce a doping (e.g., this is one way in which IGZO and other such amorphous oxides can be doped). As an alternative to an oxygen exchange layer, the TFT material in the source/drain regions 220, 221 could be implanted with a species such as fluorine to introduce doping (other suitable dopants will be apparent).

The source and drain regions 222 and 223 may also be metal or extensions of the material in the corresponding channel region (similar to source and drain regions 220 and 221 as discussed above), but in other embodiments are epitaxially deposited crystalline materials, and may include, for example, semiconductor materials such as: silicon, SiGe, germanium, silicon carbide, silicon germanium carbide, germanium tin, silicon germanium tin, or other group IV materials; or gallium arsenide (GaAs), aluminum gallium arsenide (AlGaAs), indium gallium arsenide (InGaAs), or other group III-V based ternary and quaternary alloys. In some specific embodiments, source/drain regions 222, 223 are formed of an epitaxial deposition such as, e.g., boron doped SiGe or germanium for PMOS, or phosphorus or arsenic-doped silicon for NMOS. Example contact metals for source/drain regions 222 and 223 the same metals previously noted with respect to source and drain regions 220, 221.

FIG. 2b illustrates a cross-sectional view taken parallel to and centered in the channel region of the structure with the insulator region 207 of the embodiment of FIG. 2a omitted. In this instance, each of the layers may be deposited, each in turn, on a single substrate to build a monolithic structure, such as further seen in FIG. 3b. To the extent that there are similarities between FIG. 2b and FIG. 2a, the previous relevant discussion provided with respect to FIG. 2a is equally applicable here to FIG. 2b, as will be appreciated. In this example embodiment, TFT nanowires 202 extend the length of the device, from one source or drain 220, through the gate region, into the other source or drain region 221. Sacrificial semiconductor 224 may be removed, such as by a selective etch to free the TFT nanowires 202, and replaced with a metal wrap-around contact (as discussed above). Alternatively, the stacked configuration of materials in source and drain regions 220, 221 can be removed and replaced with low resistivity metal, as previously explained.

The lateral length for nanowires (or nanoribbons, as the case may be) that is gated can vary from embodiment to embodiment, but in some cases is in the range of 3 to 50 nm (e.g., 10 to 40 nm long). Gate spacers 112, 212 may be about 2-20 nm (e.g., 3-10 nm) in lateral thickness, or other suitable dimension to prevent electrical misconnection from gate to source/drain. As will be appreciated, the gated portion if the part of the wire or ribbon that is covered by the wrap-around gate structure.

Figure 3A:
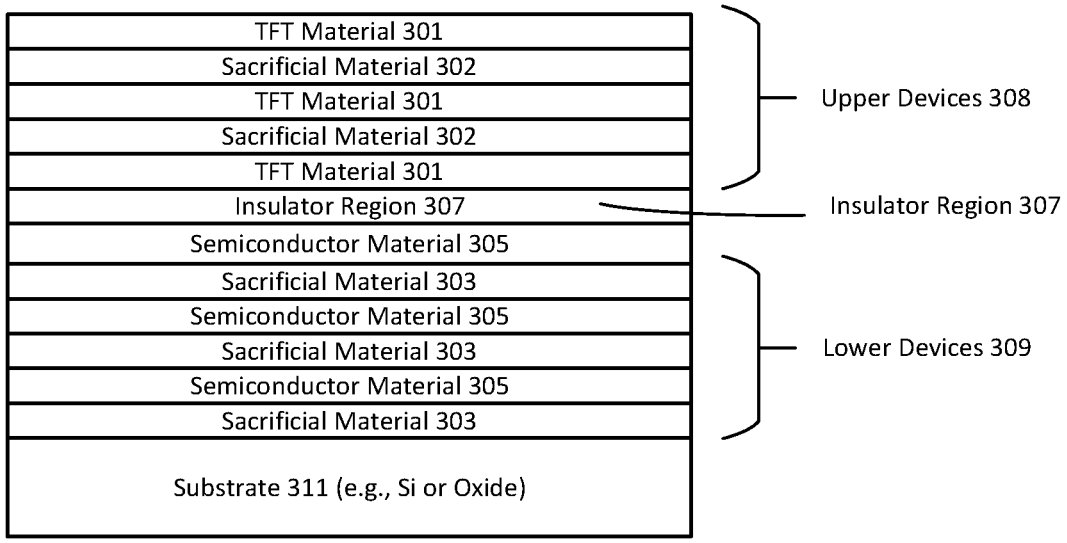
FIG. 3a illustrates a cross-section view of a stacked integrated circuit structure including an insulator region according to an embodiment of the present disclosure.

FIG. 3a illustrates a cross-section view of a stacked integrated circuit structure including an insulator region according to an embodiment of the present disclosure. In the state shown, the structure includes alternating layers of sacrificial material and TFT or semiconductor material. In particular, the upper device region 308 includes alternating layers of TFT material 301 and sacrificial material 302, and the lower device region 309 includes alternating layers of semiconductor material 305 and sacrificial material 303. An insulator region 307 separates upper device region 308 from lower device region 309. Note that the sacrificial material 302 used in the upper region 308 may be the same as the sacrificial material 303 used in the lower region 309, or not. In short, any combination of materials may be used, provided that one or more of the upper or lower channel layers are TFT materials.

The sacrificial materials 302, 303 may be any insulator and/or semiconductor materials that can be selectively etched (removed) via a given etch chemistry with respect to the TFT and semiconductor materials 301, 305 used for the nanowires or nanoribbons. The selective etch allows the channel materials (301, 305) to be released during gate processing.

In an embodiment, the TFT material 301 can be, for example, any of the previously mentioned TFT materials, and the sacrificial material 302 can be any material such as an oxide that can be selectively etched by a given etch scheme (an etch scheme that etches material 302 at a much higher rate than material 301). The insulator material 307 can be the same as material 302, but in other embodiments they are different so that material 307 also has a lower etch rate relative to material 302 for the given etch chemistry thereby allowing material 307 to remain after release processing (to liberate wires or ribbons 301 in the gated channel region, and possibly in the source/drain regions) and therefore electrically isolate the upper device region 309 from the lower device region 308. In addition, the semiconductor material 305 can be, for example, group IV material (e.g., germanium, SiGe, etc.) or a III-V material (e.g., GaAs, InGaAs, etc.), and the sacrificial material 303 can be any material that is etch selective to material 305 (e.g., silicon can be etched at a much higher rate than SiGe, for certain etch chemistries). Substrate 311 can be, for example, a bulk silicon substrate or a layer of silicon or a layer of oxide or any other material on which the alternating stack can be supported.

Figure 3B:
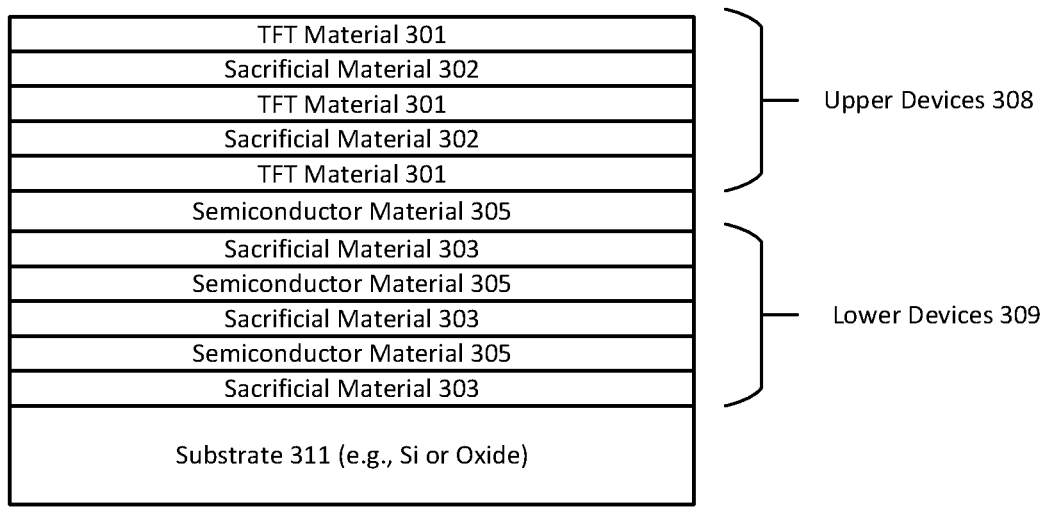
FIG. 3b illustrates a cross-section view of a stacked integrated circuit structure without an insulator region according to another embodiment of the present disclosure.

FIG. 3b illustrates a cross-section view of another embodiment in which the insulator region 307 is omitted. To the extent that there are similarities between FIG. 3b and FIG. 3a, the previous relevant discussion provided with respect to FIG. 3a (and FIG. 2a) is equally applicable here to FIG. 3b, as will be appreciated. As previously explained, the insulator region 307 can be used, for instance, to bond to separately formed alternating layer stacks together and/or to provide electrical isolation between top and bottom device regions, whereas the embodiment shown in FIG. 3b can be deposited as consecutive layers to form the multilayer stack.

Figure 4A:
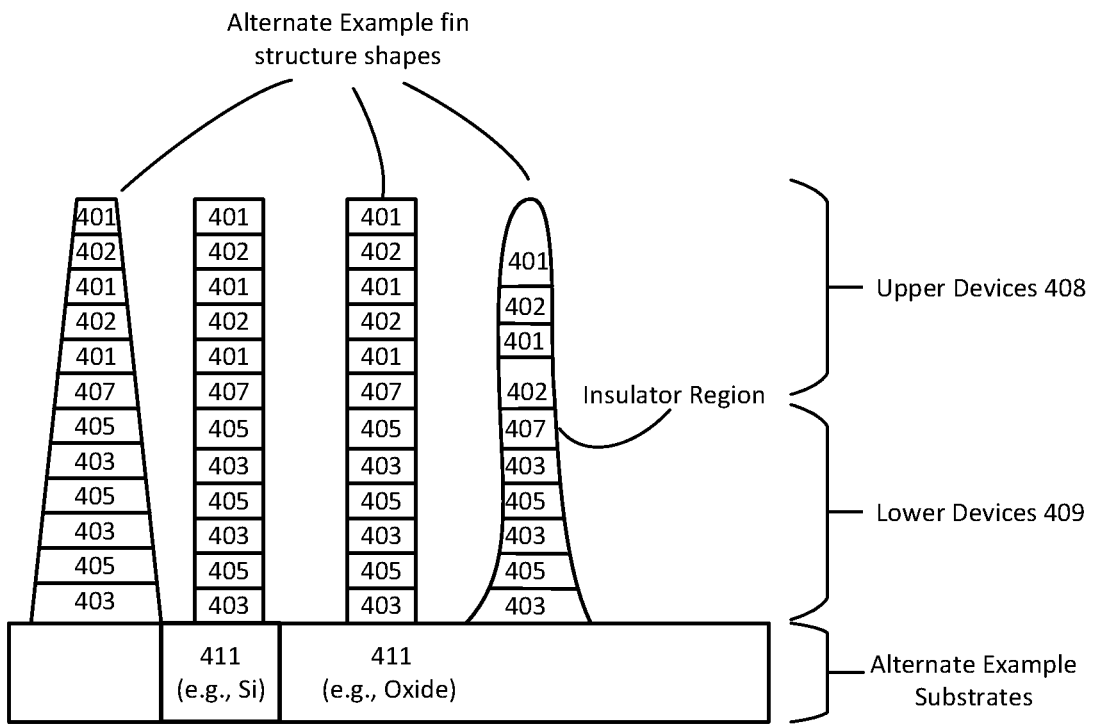
FIG. 4a illustrates a cross-section view of the integrated circuit structure of FIG. 3a after it has been etched into fin structures, in accordance with certain embodiments of the present disclosure. Note that alternative fin structures and substrates are depicted, so as to provide a number of example configurations in the same figure.
Figure 4B:
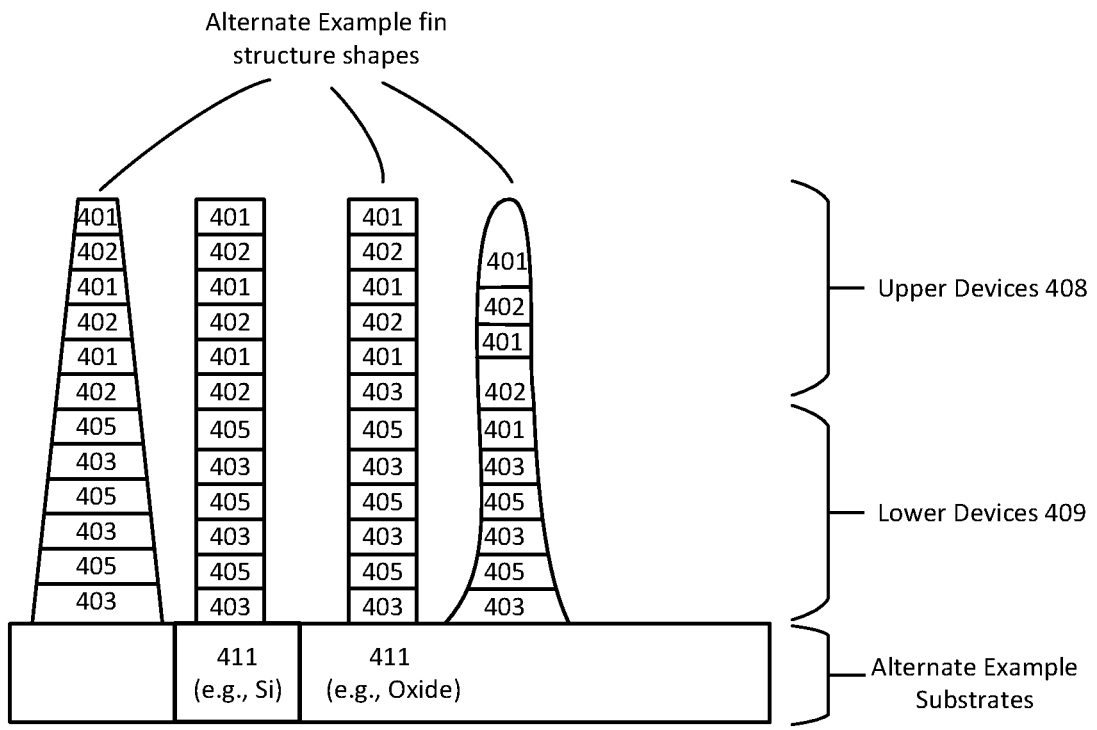
FIG. 4b illustrates another cross-section view of the integrated circuit structure of FIG. 3b after it has been etched into fin structures, in accordance with other certain embodiments of the present disclosure. Note that alternative fin structures and substrates are depicted, so as to provide a number of example configurations in the same figure.

FIGS. 4a and 4b illustrate cross-section views of the integrated circuit structures of FIGS. 3a and 3b, respectively, after having been etched into fin structures, in accordance with certain embodiments of the present disclosure. Note that alternative fin structures and substrates are depicted, so as to provide a number of example configurations in the same figure. Further note that the fin-like structures seen in FIGS. 4a and 4b (discussed below) are shown before the nanowires or nanoribbons are released (by removal of the sacrificial materials, which occurs during gate processing).

As can be seen in FIG. 4a, the example fin-like structures include two nanowires or nanoribbons 402 in the channel regions of the upper devices 408, and three nanowires or nanoribbons 405 in the channel regions of the lower devices 409. Other embodiments may have fewer or more fin-like structures containing one or more nanowires and/or nanoribbons, or some other combination of nanowires and/or nanoribbons. While the nanowires or nanoribbons are illustrated in these particular examples as having roughly equivalent vertical dimensions (thickness), in other embodiments the vertical thickness may vary from one fin structure to the next, or even within a single fin structure. Also, note that the sidewalls of the fin structures need not be straight, and in some embodiments are more tapered or trapezoidal, or hourglass shaped, or some other shape, due to the various forming processes used in making the fin structures, as will be apparent in light of the present disclosure. For instance, note that the two example fin-like structures in the middle are shown with substantially vertical sidewalls. In other embodiments, note that the resulting fin structures may be tapered such that the lateral width of layers 401 and 402 may be less than the lateral width of layers 403 and 405, such as shown in the resulting example fin structure on the right side and/or the left side. Such tapering may be, for instance, a product of the etch scheme used and/or the height of the fin structure. Further note, however, that even though the sidewalls are not perfectly vertical, the sidewalls of each material section may be collinear with one another. The rounding at the top and the flare out at the bottom (as seen in the rightmost fin-like structure) may also result from standard etch schemes or other processes, as will be appreciated.

The fin-like structures may be formed or deposited on or otherwise attached to a substrate 411, which may be, for instance, a bulk silicon substrate, or an oxide layer, or any other suitable material on which the fin structures can be supported. In some embodiments, the substrate 411 may be omitted or removed in substantial part, at some point in the transistor forming processes, and possible replaced with yet another substrate. In addition, recall that the upper device region 408 may be separated from the lower device region 408 by an insulator region 407 (as seen in FIG. 4a); however, this insulator 407 may be omitted (as seen for example in FIG. 4b) or may have one or more interconnects passing through it. For example, the insulator region 407 may have a portion exposed to provide electrical connection between the upper gate contacts and the lower gate contacts.

The fin-like structures (as seen in FIGS. 4a and 4b) effectively include nanowires and/or nanoribbons that can be released during gate processing and surrounded by a gate structure including, for instance, high-k gate dielectric material and a gate electrode. To accomplish this, the resulting fin structures are processed into stacked transistor devices, using gate-first or gate-last processing, source and drain processing, contact processing, and interconnect processing, as will be appreciated.

Figure 5A:
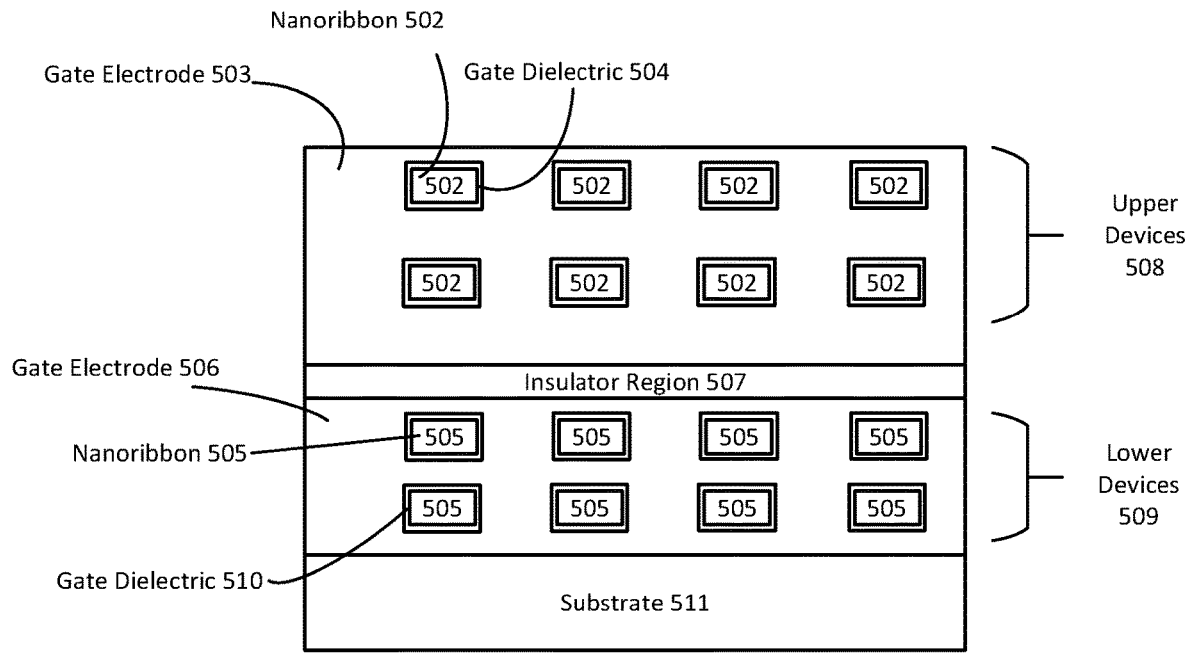
FIGS. 5a and 5b each illustrate a cross-sectional view of an integrated circuit structure, in accordance with an embodiment of the present disclosure. The cross-section is taken parallel to the gate and through the channel region.
Figure 5B:
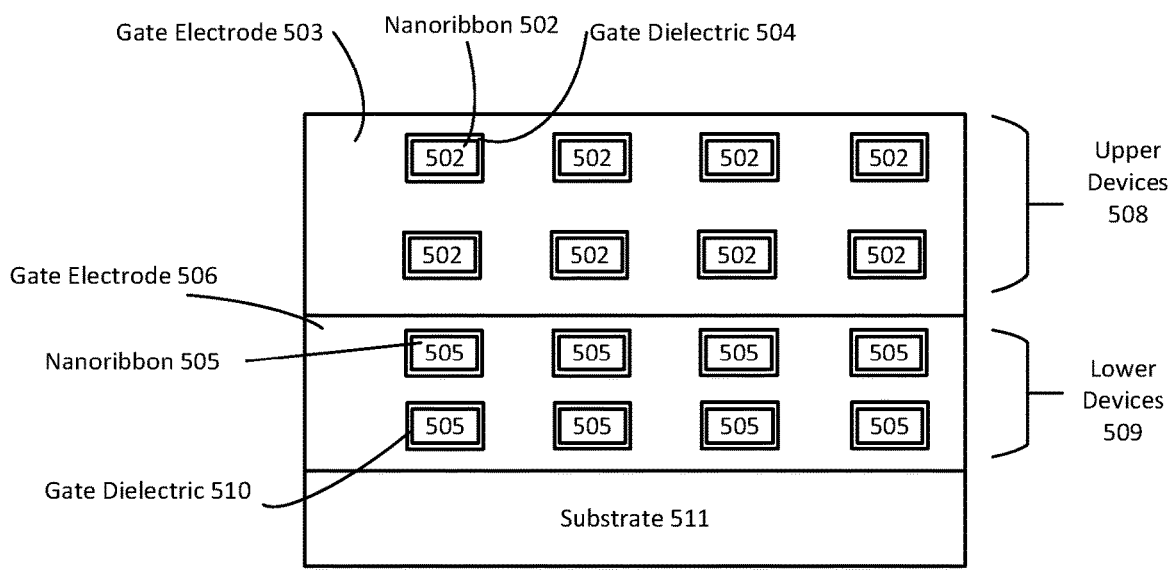

FIGS. 5a and 5b each illustrate a cross-sectional view of an integrated circuit structure, in accordance with an embodiment of the present disclosure. The cross-section is taken parallel to the gate and through the channel region. Note that FIGS. 5a and 5b show the fin structure after the nanowires or nanoribbons have been released by removal of the sacrificial material. Further note, this release need not occur over the entire length of the fin structure, but rather in some embodiments may occur only in the channel region of the device which is surrounded by the gate structure. In other embodiments, the release may be carried out in the source/drain regions as well. The release process in the channel region may be carried out, for instance, during the gate forming process, such as gate-last process after any dummy gate materials are removed but before the final gate materials are deposited.

In an embodiment, nanowires or nanoribbons 502 are formed of a TFT material in upper NMOS devices 508 while nanowires or nanoribbons 505 are formed of a group IV or III-V semiconductor material in lower PMOS devices 509. The arrangement may be reversed in some embodiments. For example, nanowires or nanoribbons 502 may be formed of a group IV or III-V semiconductor material in upper NMOS devices 508 while nanowires or nanoribbons 505 are formed of a TFT material in lower PMOS devices 509. In still other embodiments, nanowires or nanoribbons 502 are formed of a TFT material in upper NMOS devices 508 while nanowires or nanoribbons 505 are formed of a TFT material in lower PMOS devices 509.

As can be further seen, each of the nanowires or nanoribbons 502 and 505 in the upper and lower channel regions are coated, for example, with a gate dielectric 504 and 510, respectively. The gate electrodes 503 and 506 are arranged to surround the nanowires or nanoribbons in a gate-all-around type arrangement. As can be further seen, an insulator region 507 isolates part or all of the upper devices 508 from a part or all of the lower devices 509. The previous relevant discussion with respect to gate structure, channel, source/drain region, and contact configurations and materials is equally applicable here.

As will be appreciated, the use of terms like "above" "below" "upper" "lower" "top" "bottom" "vertical" and "horizontal" are simply used to facilitate discussion and are not intended to implicate a rigid structure or fixed orientation; rather such terms merely indicate spatial relationships when the structure is in a given orientation.

FIG. 5b illustrates a cross-section view of another embodiment in which the insulator region 507 is omitted between the upper and lower device regions 508 and 509. To the extent that there are similarities between FIG. 5a and FIG. 5b, the previous relevant discussion provided with respect to FIG. 5a is equally applicable here to FIG. 5b, as will be appreciated.

The integrated circuit structures of FIGS. 5a and 5b may include other features as well, as will be appreciated, such as upper and lower source and drain regions, along with source and drain contacts. In addition, the structure may further include interconnect features and layers. For instance, a first vertical interconnect feature may be provided that connects a given upper source or drain region to the corresponding lower source or drain region, and a second vertical interconnect feature may be provided that connects a given upper gate structure to the corresponding lower gate structure. Such interconnect features may be provided, for example, via standard lithographic and masking operations.

Methodology

Standard deposition techniques may be used to provide the various individual layers show in FIGS. 3a-b, such as chemical vapor deposition (CVD), physical layer deposition (PLD), and atomic layer deposition (ALD). Likewise, standard layer transfer processes can be used to join structures formed separately on different substrates.

The resulting stack as well as the individual layers can have any number of thicknesses and are not necessarily drawn to scale. For instance, in some such example embodiments, the vertical thickness of substrate layer 311 is in the range of 30 to 500 nanometers (nm). In some embodiments, the vertical thickness of the alternating layers of sacrificial material 302 and TFT material 301 (in the upper devices 308), as well as the vertical thickness of the alternating layers of the sacrificial material 303 and semiconductor material 305 (in the lower devices 309) are each in the range of about 4 to 50 nm (e.g., 4 to 25 nm thick, or 5 to 10 nm thick). In some embodiments, the insulator region 307, if present, is in the range of 5 to 50 nm thick. In a more general sense, the wires or ribbons as well as the insulator region (if present) may have any geometry suitable for a given application.

The substrate layer 311 may be, for instance, a layer of silicon dioxide on a bulk silicon, or the oxide layer of a semiconductor-on-insulator (SOI) substrate configuration, although any number of other configurations may be used as well, as will be appreciated. In still other embodiments, the substrate 311 may include an oxide layer which may be a converted layer (a silicon layer that has been converted to silicon dioxide during an oxygen-based annealing process). In other embodiments, the substrate 311 is optional and not used or is substantially removed due to processing. In such cases, substrate 311 could be replaced, for example, with a bulk substrate or other supportive structure.

As previously explained, the sacrificial material 302 and/or 303 may be any insulator or semiconductor material that can be selectively removed via a given etch chemistry with respect to the TFT material 301 and/or semiconductor material 305 used for the nanowires or nanoribbons (i.e., the etch chemistry removes the sacrificial material 302 and/or 303 at a much higher rate than it removes channel materials 301 and/or 305, such as 3× to 10× faster). Channel materials 301 and/or 305 may be the same or different. Note that, the role of sacrificial and channel materials can be reversed, depending on the type of transistor device being formed. For example: for NMOS transistors of a given integrated circuit, material 303 (e.g., silicon) may serve as the channel material and material 305 (e.g., SiGe) may serve as the sacrificial material; and for PMOS transistors, material 303 (e.g., silicon) may serve as the sacrificial material and material 305 (e.g., SiGe) may serve as the channel material. In any such cases, the etch chemistry can be chosen for its selectivity to the nanowire/nanoribbon material (i.e., the desired channel material), relative to the material that is to be removed or otherwise etched at a much higher rate (i.e., the sacrificial material).

The insulator region 307 may be, for example, a discrete layer of insulation material between upper devices 308 and lower devices 309. Alternatively, insulator region 307 may be a doped region of either (or both) of the adjacent upper devices 308 or lower devices 309. In such cases, the doped region effectively impairs flow of carriers across that region 307, thereby inhibiting sub-channel leakage, much like a layer of insulation material. In a more general sense, any isolation techniques and/or layers may be used to implement insulator region 307, as will be appreciated in light of this disclosure. Moreover, selective connection may be made across one or more of the corresponding upper and lower gate contacts, source, and/or drains.

In one example embodiment, sacrificial materials 302 and/or 303 are oxides, such as silicon dioxide, germanium oxide, or silicon germanium oxide. In one specific such embodiment, semiconductor 305 includes silicon, insulator region 307 includes silicon nitride, and TFT material 301 includes a high mobility TFT material such as indium gallium zinc oxide (InGaZnO or IGZO). In such a case, the structure may have silicon nanowires or nanoribbons (formed from semiconductor layers 305) for PMOS devices in the lower region, and InGaZnO nanoribbons (formed from TFT layer 301) for NMOS devices in the upper region. Note that layers 302, 303, and 307 may be any combination of materials that facilitate an etch electivity with respect to a given etch chemistry, to allow for release of the materials 301, 305 making up the nanowires or nanoribbons in the upper and/or lower channel regions. Numerous such material systems will be apparent, including but not limited to group IV semiconductor materials, group III-V semiconductor materials, and semiconductor oxides, to provide various PMOS and NMOS devices.

FIG. 4a shows a structure after fin-like structures have been patterned and etched, according to an embodiment with the insulator region 407. Standard masking and etch techniques may be used, including wet and/or dry as well as isotropic and/or anisotropic etch schemes, as will be appreciated. Note the etch chemistry may change during the etch process to accommodate the change in materials making up the stack.

FIG. 4b shows an embodiment of the resulting structure which omits the insulator region 407. To the extent that there are similarities between FIG. 4a and FIG. 4b, the previous relevant discussion provided with respect to FIG. 4a is equally applicable here to FIG. 4b, as will be appreciated FIG. 5a shows the resulting structure after the nanoribbons 501 and 505 have been released in the channel regions of the upper and lower device regions 508 and 509, respectively, and gate processing has concluded. As previously explained, the release process may be, for example, part of a gate forming process where the channel region is first exposed by removing any dummy gate materials (if a gate-last process is used), followed by an etch that is selective to the nanoribbon 502 and 505 and not the sacrificial material (i.e., the etch removes the sacrificial material at a much higher rate than the nanoribbons 502 and 505). Note that the release is only carried out in the channel region and not necessarily in the source or drain regions, according to some embodiments.

Any number of selective etch schemes may be used depending on the material systems used, as will be appreciated. For instance, in one example embodiment assume the sacrificial material is silicon and the channel (wire/ribbon) material is SiGe or germanium. Etch chemistries such as aqueous hydroxide chemistries, including ammonium hydroxide and potassium hydroxide, for example, may be utilized to selectively etch the sacrificial silicon but mostly leave the germanium-containing channels in place. Numerous other selective etch chemistries will be apparent.

In certain embodiments, the nanoribbons 502 and 505 may be released in the source and drain regions as well as in the gated channel region by removal of the sacrificial material. Either the sacrificial material (or the sacrificial material and the TFT material) may be removed from the source and drain regions and replaced with metal during source/drain processing, as previously explained. Gate spacers (shown in FIGS. 2a and 2b) may be formed during gate processing or after removal of one or more of the sacrificial material and/or channel material and before deposition of the metal contact.

Note that in a gate-first process, the source/drain processing may be carried out after the final gate structure is formed. However, in a gate-last process, the source/drain processing is carried out before the final gate structure is formed (when dummy gate materials are present in the channel region). Other modifications may be appreciated in light of the present disclosure. Any suitable source/drain materials and deposition techniques may be used, as previously explained (for both non-TFT and TFT source/drain regions). In some such embodiments, epi source/drain regions have a faceted top surface. In other such embodiments, excess epi deposition may be removed by way of a planarization process (e.g., CMP) resulting in a flat top surface of the source/drain region. In still other embodiments, source/drain regions may be provided without using an etch and replace scheme. For instance, in some such cases, the fin structures in the source/drain regions may be exposed via a selective etch to form trenches. An implantation doping scheme may then be utilized to dope the source/drain regions of the exposed fins as desired. The previous discussion with respect to TFT source/drain regions and crystalline source/drain regions is equally applicable here. Numerous source/drain forming techniques may be used, as will be appreciated in light of this disclosure.

Computing System

Figure 6:
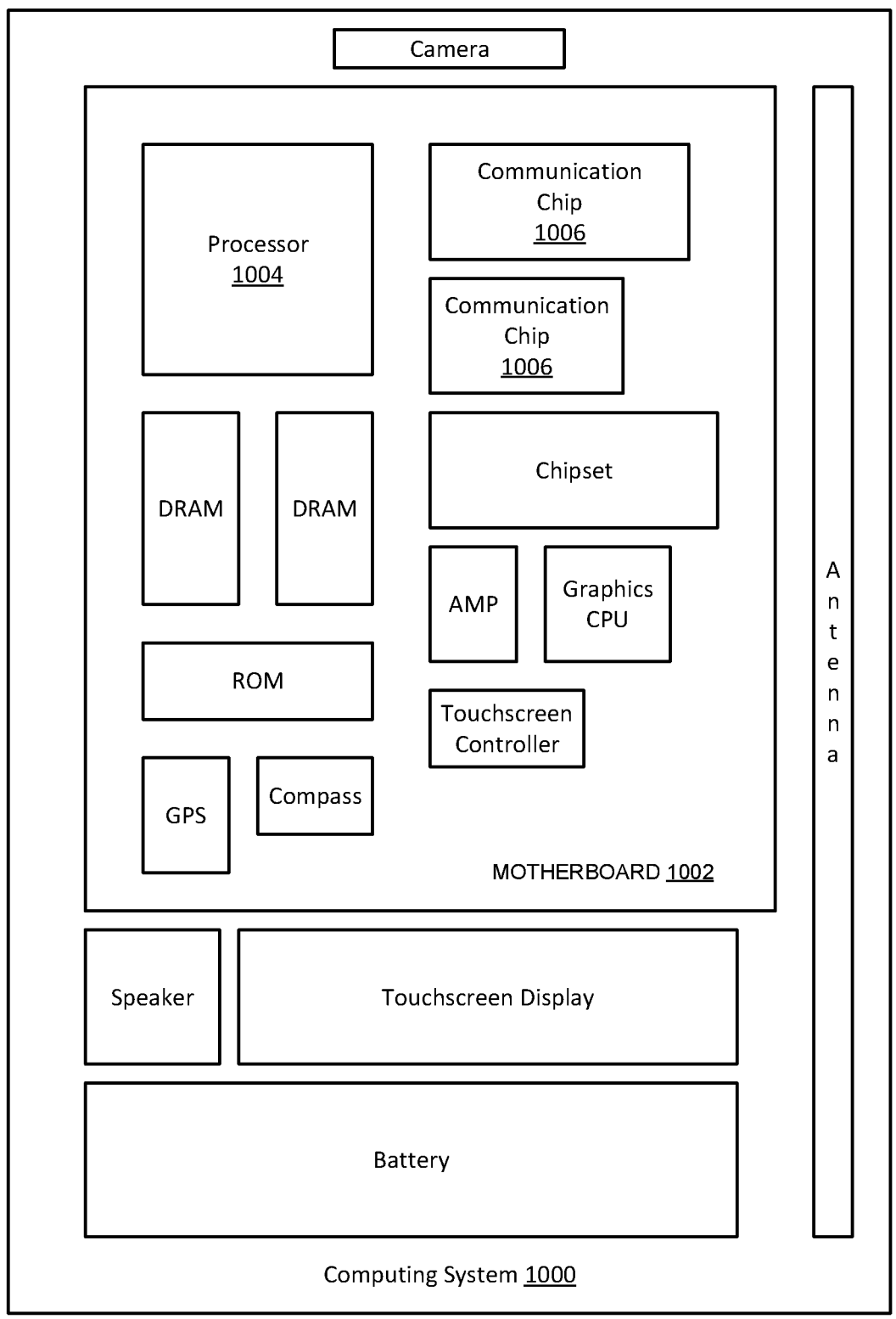
FIG. 6 illustrates a block diagram of a computing system including one or more of the 3D stacked integrated circuit structures, in accordance with an embodiment of the present disclosure.

FIG. 6 illustrates a computing system implemented with one or more integrated circuit structures configured in accordance with an embodiment of the present disclosure. As can be seen, the computing system 1000 houses a motherboard 1002. The motherboard 1002 may include a number of components, including but not limited to a processor 1004 and at least one communication chip 1006 (two are shown in this example), each of which can be physically and electrically coupled to the motherboard 1002, or otherwise integrated therein. As will be appreciated, the motherboard 1002 may be, for example, any printed circuit board, whether a main board or a daughterboard mounted on a main board or the only board of system 1000, etc.

Depending on its applications, computing system 1000 may include one or more other components that may or may not be physically and electrically coupled to the motherboard 1002. These other components may include, but are not limited to, volatile memory (e.g., DRAM), non-volatile memory (e.g., ROM), a graphics processor, a digital signal processor, a crypto processor, AI processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), solid state drive (SSD) and so forth). Any of the components included in computing system 1000 may include one or more integrated circuits configured with a stacked transistor structure having a one or more TFT regions stacked on a PMOS and/or NMOS device region, as variously described herein. In some embodiments, multiple functions can be integrated into one or more chips (e.g., for instance, note that the communication chip 1006 can be part of or otherwise integrated into the processor 1004).

The communication chip 1006 enables wireless communications for the transfer of data to and from the computing system 1000. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1006 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing system 1000 may include a plurality of communication chips 1006. For instance, a first communication chip 1006 may be dedicated to shorter range wireless communications such as Wi-Fi and Bluetooth and a second communication chip 1006 may be dedicated to longer range wireless communications such as GPS, EDGE, GPRS, CDMA, WiMAX, LTE, Ev-DO, and others. The processor 1004 of the computing system 1000 includes an integrated circuit die packaged within the processor 1004. In some example embodiments of the present disclosure, the integrated circuit die of the processor 1004 includes one or more stacked TFT transistor structures as variously provided herein. The term "processor" may refer to any device or portion of a device that processes, for instance, electronic data from registers and/or memory to transform that electronic data into other electronic data that may be stored in registers and/or memory.

The communication chip 1006 may also include an integrated circuit die packaged within the communication chip 1006. In accordance with some such example embodiments, the integrated circuit die of the communication chip 1006 includes one or more stacked TFT transistor structures as variously provided herein. As will be appreciated in light of this disclosure, note that multi-standard wireless capability may be integrated directly into the processor 1004 (e.g., where functionality of any chips 1006 is integrated into processor 1004, rather than having separate communication chips). Further note that processor 1004 may be a chip set having such wireless capability. In short, any number of processor 1004 and/or communication chips 1006 may be used. Likewise, any one chip or chip set can have multiple functions integrated therein.

In various implementations, the computing system 1000 may be a laptop, a netbook, a notebook, a smartphone, smartwatch, a tablet, a personal digital assistant (PDA), an ultra-mobile PC, a mobile phone, a desktop computer, a server, a printer, a scanner, a monitor, a set-top box, an entertainment control unit, a digital camera, a portable music player, or a digital video recorder. In further implementations, the system 1000 may be any other electronic device that processes data or employs one or more stacked TFT transistor structures as variously provided herein. As will be appreciated in light of this disclosure, various embodiments of the present disclosure can be used to improve performance on products fabricated at any process node (e.g., in the micron range, or sub-micron and beyond) by allowing for the use of vertically stacked TFT transistors having any number of source/drain configurations and channel configurations (e.g., Si, Ge, SiGe, multilayer structure of Si and SiGe, III-V such as gallium nitride or InGaAs, a semiconducting oxide such as nickel oxide or IGZO, and/or combinations thereof).

FURTHER EXAMPLE EMBODIMENTS

The following examples pertain to further embodiments, from which numerous permutations and configurations will be apparent.

Example 1 includes an integrated circuit structure, comprising: a first transistor structure including a first nanowire or nanoribbon extending between a first source region and a first drain region; a first gate electrode wrapped around the first nanowire or nanoribbon; and a first gate dielectric between the first nanowire or nanoribbon and the first gate electrode; and a second transistor structure above the first transistor structure and arranged in a stacked configuration with the first transistor structure, the second transistor structure including a second nanowire or nanoribbon extending between a second source region and a second drain region; a second gate electrode wrapped around the second nanowire or nanoribbon; and a second gate dielectric between the second nanowire or nanoribbon and the second gate electrode; wherein one or both of the first and second nanowire or nanoribbon includes a semiconducting oxide material.

Example 2 includes the subject matter of Example 1, wherein both of the first and second nanowire or nanoribbon includes a semiconducting oxide material.

Example 3 includes the subject matter of Example 1 or 2, wherein the second nanowire or nanoribbon is compositionally different from the first nanowire or nanoribbon.

Example 4 includes the subject matter of any of the preceding Examples, wherein the semiconducting oxide material comprises oxygen and at least one of nickel, indium, gallium, and zinc.

Example 5 includes the subject matter of any of the preceding Examples, wherein the second transistor structure is self-aligned with the first transistor structure.

Example 6 includes the subject matter of any of the preceding Examples, wherein the first gate dielectric includes a high-k dielectric material.

Example 7 includes the subject matter of any of the preceding Examples, wherein the second gate dielectric includes a high-k material.

Example 8 includes the subject matter of any of the preceding Examples, further comprising an insulator region between the first transistor structure and the second transistor structure.

Example 9 includes the subject matter of Example 8, wherein, the insulator region comprises an insulator material that is compositionally different from the first and second gate dielectrics.

Example 10 includes the subject matter of any of the preceding Examples, wherein the first nanowire or nanoribbon includes a crystalline semiconductor material, and the second nanowire or nanoribbon includes a semiconducting oxide material.

Example 11 includes the subject matter of any of the preceding Examples, wherein the first transistor structure is a p-type metal oxide semiconductor (PMOS) device, and the second transistor structure is an n-type metal oxide semiconductor (NMOS) device.

Example 12 includes the subject matter of Example 10 or 11, wherein the crystalline semiconductor material comprises at least one of silicon and germanium, and the semiconducting oxide material comprises oxygen and at least one of indium, gallium, and zinc.

Example 13 includes the subject matter of any of Examples 10 to 12, wherein the crystalline semiconductor material comprises a group IV or group III-V semiconductor material.

Example 14 includes the subject matter of any of Examples 1 to 9, wherein the first nanowire or nanoribbon includes a first semiconducting oxide material, and the second nanowire or nanoribbon includes a second semiconducting oxide material.

Example 15 includes the subject matter of Example 14, wherein the first transistor structure is a PMOS device, and the second transistor structure is an NMOS device.

Example 16 includes the subject matter of any of Examples 14 or 15, wherein the first transistor structure is an NMOS device, and the second transistor structure is a PMOS device.

Example 17 includes the subject matter of any of Examples 1 to 9, wherein the second nanowire or nanoribbon includes a crystalline semiconductor material, and the first nanowire or nanoribbon includes a semiconducting oxide material.

Example 18 includes the subject matter of Example 17, wherein the second transistor structure is a PMOS device, and the first transistor structure is an NMOS device.

Example 19 includes the subject matter of Examples 17 or 18, wherein the crystalline semiconductor material comprises at least one of silicon and germanium, and the semiconducting oxide material comprises oxygen and at least one of indium, gallium, and zinc.

Example 20 includes the subject matter of any of Examples 17 to 19, wherein the crystalline semiconductor material comprises a group IV or group III-V semiconductor material.

Example 21 includes the subject matter of any of the preceding Examples, wherein the first nanowire or nanoribbon continues into the first source and drain regions, and/or the second nanowire or nanoribbon continues into the second source and drain regions.

Example 22 includes the subject matter of any of the preceding Examples, wherein the first nanowire or nanoribbon is compositionally different from the first source and drain regions, and/or the second nanowire or nanoribbon is compositionally different from the second source and drain regions.

Example 23 includes the subject matter of any of the preceding Examples, wherein the semiconducting oxide material includes one or more of indium-gallium-zinc oxide (InGaZnO or IGZO), gallium oxide (GaO), zinc oxide (ZnO), indium oxide (InO), antimony oxide (SbO), copper oxide (CuO), indium antimony oxide (InSbO), aluminum zinc oxide (AlZnO), molybdenum disulfide ($MoS_2$), cadmium oxide (CdO), indium(III) oxide ($In_2O_3$), gallium(III) oxide ($Ga_2O_3$), tin(IV) oxide ($SnO_2$), indium zinc oxide (IZO), indium tin oxide (ITO), gallium zinc oxide (GZO), titanium dioxide ($TiO_2$), tin(II) oxide (SnO), cuprous oxide ($Cu_2O$), copper(II) oxide (CuO), vanadium(IV) oxide ($VO_2$), nickel/nickel(II) oxide (NiO), zinc rhodium oxide ($ZnRh_2O_4$), aluminum copper dioxide ($AlCuO_2$), strontium cuprate (SCO) ($SrCu_2O_2$), and lanthanum selenium dioxide ($La_2SeO_2$).

Example 24 includes the subject matter of any of the preceding Examples, wherein the semiconducting oxide material includes indium, gallium, zinc, and oxygen.

Example 25 includes the subject matter of any of the preceding Examples, wherein the integrated circuit structure is a part of a computing system.

Example 26 includes an integrated circuit structure, comprising: a first transistor structure including a first nanowire or nanoribbon extending between a first source region and a first drain region, and including a crystalline semiconductor; a first gate electrode wrapped around the first nanowire or nanoribbon; and a first gate dielectric between the first nanowire or nanoribbon and the first gate electrode, and including a high-k dielectric material; and a second transistor structure above the first transistor structure and arranged in a stacked configuration with the first transistor structure, the second transistor structure including a second nanowire or nanoribbon extending between a second source region and a second drain region, and including a semiconducting oxide; a second gate electrode wrapped around the second nanowire or nanoribbon; and a second gate dielectric between the second nanowire or nanoribbon and the second gate electrode, and including a high-k dielectric material.

Example 27 includes the subject matter of Example 26, wherein the semiconducting oxide material comprises oxygen and at least one of nickel, indium, gallium, and zinc.

Example 28 includes the subject matter of Examples 26 or 27, further comprising an insulator region between the first transistor structure and the second transistor structure.

Example 29 includes the subject matter of Example 28, wherein the insulator region comprises an insulator material that is compositionally different from the first and second gate dielectrics.

Example 30 includes the subject matter of any of Examples 26 to 29, wherein the first transistor structure is a p-type metal oxide semiconductor (PMOS) device, and the second transistor structure is an n-type metal oxide semiconductor (NMOS) device.

Example 31 includes the subject matter of any of Examples 26 to 30, wherein the crystalline semiconductor material comprises at least one of silicon and germanium, and the semiconducting oxide material comprises oxygen and at least one of indium, gallium, and zinc.

Example 32 includes the subject matter of any of Examples 26 to 31, wherein the crystalline semiconductor material comprises a group IV or group III-V semiconductor material.

Example 33 includes the subject matter of any of Examples 26 to 32, wherein the first nanowire or nanoribbon continues into the first source and drain regions, and/or the second nanowire or nanoribbon continues into the second source and drain regions.

Example 34 includes the subject matter of any of Examples 26 to 33, wherein the first nanowire or nanoribbon is compositionally different from the first source and drain regions, and/or the second nanowire or nanoribbon is compositionally different from the second source and drain regions.

Example 35 includes an integrated circuit structure, comprising: a first transistor structure including a first nanowire or nanoribbon extending between a first source region and a first drain region, and including a first semiconducting oxide; a first gate electrode wrapped around the first nanowire or nanoribbon; and a first gate dielectric between the first nanowire or nanoribbon and the first gate electrode, and including a high-k dielectric material; and a second transistor structure above the first transistor structure and arranged in a stacked configuration with the first transistor structure, the second transistor structure including a second nanowire or nanoribbon extending between a second source region and a second drain region, and including a second semiconducting oxide; a second gate electrode wrapped around the second nanowire or nanoribbon; and a second gate dielectric between the second nanowire or nanoribbon and the second gate electrode, and including a high-k dielectric material.

Example 36 includes the subject matter of Example 35, wherein the first and/or second semiconducting oxide material comprises oxygen and at least one of nickel, indium, gallium, and zinc.

Example 37 includes the subject matter of Example 35 or 36, further comprising an insulator region between the first transistor structure and the second transistor structure.

Example 38 includes the subject matter of Example 37, wherein the insulator region comprises an insulator material that is compositionally different from the first and second gate dielectrics.

Example 39 includes the subject matter of any of Examples 35 to 38, wherein the first transistor structure is a p-type metal oxide semiconductor (PMOS) device, and the second transistor structure is an n-type metal oxide semiconductor (NMOS) device.

Example 40 includes the subject matter of any of Examples 35 to 38, wherein the second transistor structure is a PMOS device, and the first transistor structure is an NMOS device.

Example 41 includes the subject matter of any of Examples 35 to 40, wherein the first nanowire or nanoribbon continues into the first source and drain regions, and/or the second nanowire or nanoribbon continues into the second source and drain regions.

Example 42 includes the subject matter of any of Examples 35 to 41, wherein the first nanowire or nanoribbon is compositionally different from the first source and drain regions, and/or the second nanowire or nanoribbon is compositionally different from the second source and drain regions.

Example 43 includes the subject matter of any of Examples 35 to 42, wherein the first and second semiconducting oxide materials include one or more of indium-gallium-zinc oxide (InGaZnO or IGZO), gallium oxide (GaO), zinc oxide (ZnO), indium oxide (InO), antimony oxide (SbO), copper oxide (CuO), indium antimony oxide (InSbO), aluminum zinc oxide (AlZnO), molybdenum disulfide ($MoS_2$), cadmium oxide (CdO), indium(III) oxide ($In_2O_3$), gallium(III) oxide ($Ga_2O_3$), tin(IV) oxide ($SnO_2$), indium zinc oxide (IZO), indium tin oxide (ITO), gallium zinc oxide (GZO), titanium dioxide ($TiO_2$), tin(II) oxide (SnO), cuprous oxide ($Cu_2O$), copper(II) oxide (CuO), vanadium(IV) oxide ($VO_2$), nickel/nickel(II) oxide (NiO), zinc rhodium oxide ($ZnRh_2O_4$), aluminum copper dioxide ($AlCuO_2$), strontium cuprate (SCO) ($SrCu_2O_2$), and lanthanum selenium dioxide ($La_2SeO_2$).

The foregoing description of example embodiments of the present disclosure has been presented for the purposes of illustration and description. It is not intended to be exhaustive or to limit the present disclosure to the precise forms disclosed. Many modifications and variations are possible in light of this disclosure. It is intended that the scope of the present disclosure be limited not by this detailed description, but rather by the claims appended hereto.

What is claimed is:

1. An integrated circuit structure, comprising:
a first transistor structure including a first nanowire or nanoribbon extending between a first source region and a first drain region, a first gate electrode wrapped around the first nanowire or nanoribbon, and a first gate dielectric between the first nanowire or nanoribbon and the first gate electrode; and
a second transistor structure above the first transistor structure and arranged in a stacked configuration with the first transistor structure, the second transistor structure including a second nanowire or nanoribbon extending between a second source region and a second drain region, a second gate electrode wrapped around the second nanowire or nanoribbon, and a second gate dielectric between the second nanowire or nanoribbon and the second gate electrode, wherein one of the first or second nanowire or nanoribbon includes a semiconducting oxide material, and wherein the second nanowire or nanoribbon is compositionally different from the first nanowire or nanoribbon.

2. The integrated circuit structure of claim 1, wherein the other one of the first or second nanowire or nanoribbon includes a second semiconducting oxide material.

3. The integrated circuit structure of claim 2, wherein the first nanowire or nanoribbon includes the semiconducting oxide material, and the second nanowire or nanoribbon includes the second semiconducting oxide material.

4. The integrated circuit structure of claim 3, wherein the first transistor structure is a PMOS device, and the second transistor structure is an NMOS device.

5. The integrated circuit structure of claim 3, wherein the first transistor structure is an NMOS device, and the second transistor structure is a PMOS device.

6. The integrated circuit structure of claim 1, wherein the semiconducting oxide material comprises oxygen and at least one of nickel, indium, gallium, and zinc.

7. The integrated circuit structure of claim 1, further comprising an insulator region between the first transistor structure and the second transistor structure.

8. The integrated circuit structure of claim 7, wherein the insulator region comprises an insulator material that is compositionally different from the first and second gate dielectrics.

9. The integrated circuit structure of claim 1, wherein the first nanowire or nanoribbon includes a crystalline semiconductor material, and the second nanowire or nanoribbon includes the semiconducting oxide material.

10. The integrated circuit structure of claim 9, wherein the first transistor structure is a p-type metal oxide semiconductor (PMOS) device, and the second transistor structure is an n-type metal oxide semiconductor (NMOS) device.

11. The integrated circuit structure of claim 9, wherein the crystalline semiconductor material comprises at least one of silicon and germanium, and the semiconducting oxide material comprises oxygen and at least one of indium, gallium, and zinc.

12. The integrated circuit structure of claim 9, wherein the crystalline semiconductor material comprises a group IV or group III-V semiconductor material.

13. The integrated circuit structure of claim 1, wherein the second nanowire or nanoribbon includes a crystalline semiconductor material, and the first nanowire or nanoribbon includes the semiconducting oxide material.

14. The integrated circuit structure of claim 13, wherein the second transistor structure is a PMOS device, and the first transistor structure is an NMOS device.

15. The integrated circuit structure of claim 13, wherein the crystalline semiconductor material comprises at least one of silicon and germanium, and the semiconducting oxide material comprises oxygen and at least one of indium, gallium, and zinc.

16. The integrated circuit structure of claim 13, wherein the crystalline semiconductor material comprises a group IV or group III-V semiconductor material.

17. The integrated circuit structure of claim 1, wherein the first nanowire or nanoribbon is compositionally different from the first source and drain regions, and/or the second nanowire or nanoribbon is compositionally different from the second source and drain regions.

18. The integrated circuit structure of claim 1, wherein the semiconducting oxide material includes indium, gallium, zinc, and oxygen.

19. An integrated circuit structure, comprising:
a first transistor structure including a first nanowire or nanoribbon extending between a first source region and a first drain region, and including a crystalline semiconductor;
a first gate electrode wrapped around the first nanowire or nanoribbon; and
a first gate dielectric between the first nanowire or nanoribbon and the first gate electrode, and including a high-k dielectric material; and
a second transistor structure above the first transistor structure and arranged in a stacked configuration with the first transistor structure, the second transistor structure including a second nanowire or nanoribbon extending between a second source region and a second drain region, and including a semiconducting oxide; a second gate electrode wrapped around the second nanowire or nanoribbon; and
a second gate dielectric between the second nanowire or nanoribbon and the second gate electrode, and including a high-k dielectric material.

20. The integrated circuit structure of claim 19, wherein the crystalline semiconductor material comprises at least one of silicon and germanium, and the semiconducting oxide material comprises oxygen and at least one of indium, gallium, and zinc.

21. The integrated circuit structure of claim 19, wherein the first nanowire or nanoribbon is compositionally different from the first source and drain regions, and/or the second nanowire or nanoribbon is compositionally different from the second source and drain regions.

22. An integrated circuit structure, comprising:
a first transistor structure including a first nanowire or nanoribbon extending between a first source region and a first drain region, and including a first semiconducting oxide;
a first gate electrode wrapped around the first nanowire or nanoribbon; and
a first gate dielectric between the first nanowire or nanoribbon and the first gate electrode, and including a high-k dielectric material; and
a second transistor structure above the first transistor structure and arranged in a stacked configuration with the first transistor structure, the second transistor structure including a second nanowire or nanoribbon extending between a second source region and a second drain region, and including a second semiconducting oxide, wherein the second nanowire or nanoribbon is compositionally different from the first nanowire or nanoribbon;
a second gate electrode wrapped around the second nanowire or nanoribbon; and
a second gate dielectric between the second nanowire or nanoribbon and the second gate electrode, and including a high-k dielectric material.

23. The integrated circuit structure of claim 22, wherein the first nanowire or nanoribbon is compositionally different from the first source and drain regions, and/or the second nanowire or nanoribbon is compositionally different from the second source and drain regions.

24. The integrated circuit structure of claim 22, wherein the first and second semiconducting oxide materials include one or more of indium-gallium-zinc oxide (InGaZnO or IGZO), gallium oxide (GaO), zinc oxide (ZnO), indium oxide (InO), antimony oxide (SbO), copper oxide (CuO), indium antimony oxide (InSbO), aluminum zinc oxide (AlZnO), molybdenum disulfide ($MoS_2$), cadmium oxide (CdO), indium(III) oxide ($In_2O_3$), gallium(III) oxide ($Ga_2O_3$), tin(IV) oxide ($SnO_2$), indium zinc oxide (IZO), indium tin oxide (ITO), gallium zinc oxide (GZO), titanium dioxide ($TiO_2$), tin(II) oxide (SnO), cuprous oxide ($Cu^2O$), copper(II) oxide (CuO), vanadium(IV) oxide ($VO_2$), nickel/nickel(II) oxide (NiO), zinc rhodium oxide ($ZnRh_2O_4$), aluminum copper dioxide ($AlCuO_2$), strontium cuprate (SCO) ($SrCu_2O_2$), and lanthanum selenium dioxide ($La_2SeO_2$).

* * * * *